(12) United States Patent
Furber

(10) Patent No.: US 7,512,572 B2
(45) Date of Patent: Mar. 31, 2009

(54) DIGITAL MEMORY

(75) Inventor: Stephen B. Furber, Wilmsiow (GB)

(73) Assignee: Cogniscience Limited, Manchester (GB)

( * ) Notice: Subject to any disclaimer, the term of this patent is extended or adjusted under 35 U.S.C. 154(b) by 226 days.

(21) Appl. No.: 10/509,086

(22) PCT Filed: Oct. 14, 2002

(86) PCT No.: PCT/GB02/04650

§ 371 (c)(1),
(2), (4) Date: Jun. 29, 2005

(87) PCT Pub. No.: WO03/083669

PCT Pub. Date: Oct. 9, 2003

(65) Prior Publication Data

US 2005/0281116 A1    Dec. 22, 2005

(30) Foreign Application Priority Data

Mar. 28, 2002    (GB) ................. 0207372.4

(51) Int. Cl.
*G06E 1/00* (2006.01)
*G06E 3/00* (2006.01)
(52) U.S. Cl. .................................. 706/15; 706/43
(58) Field of Classification Search .............. 706/15, 706/41, 43; 711/108, 211, 170, 169
See application file for complete search history.

(56) References Cited

U.S. PATENT DOCUMENTS

| | | | | |
|---|---|---|---|---|
| 5,113,507 | A | * | 5/1992 | Jaeckel ................ 711/5 |
| 5,457,408 | A | | 10/1995 | Leung |
| 5,829,009 | A | | 10/1998 | Frazier |
| 6,037,626 | A | * | 3/2000 | Thewes et al. ............. 257/319 |
| 6,374,385 | B1 | * | 4/2002 | Hamalainen et al. ........ 714/786 |
| 6,460,112 | B1 | * | 10/2002 | Srinivasan et al. .......... 711/108 |

(Continued)

FOREIGN PATENT DOCUMENTS

EP    0626650 A    11/1994

(Continued)

OTHER PUBLICATIONS

Mano, Morris, "Computer System Architecture", Prentice Hall, Third Edition, pp. 43-44, 456-460, 472-475, 1992.*

(Continued)

*Primary Examiner*—David R Vincent
*Assistant Examiner*—Adrian L Kennedy
(74) *Attorney, Agent, or Firm*—Nixon & Vanderhye PC

(57) ABSTRACT

A memory configuration for use in a computer system includes a plurality of address decoders each of which is allocated an identifier having a predetermined number of bits, each bit having first and second selectable states. A data memory having a plurality of word lines of predetermined length, is also included in each of the address decoders and is activatable to select one of the plurality of word lines. The address decoders receive an input address having a predetermined number of bits and compare the identifier of an address decoder with the input address wherein the memory further activates an address decoder if at least a predetermined minimum number of bits set to the first selectable state in the input address correspond to bits set to the first selectable state in the decoder identifier.

31 Claims, 3 Drawing Sheets

U.S. PATENT DOCUMENTS

| | | | | |
|---|---|---|---|---|
| 6,473,846 | B1 * | 10/2002 | Melchior | 711/170 |
| 6,597,595 | B1 * | 7/2003 | Ichiriu et al. | 365/49 |
| 6,707,693 | B1 * | 3/2004 | Ichiriu | 365/49 |
| 7,043,673 | B1 * | 5/2006 | Ichiriu et al. | 714/719 |

FOREIGN PATENT DOCUMENTS

| WO | WO 90/04830 | 5/1990 |
|---|---|---|

OTHER PUBLICATIONS

Aleksander, I. et al., "Guide to Pattern Recognition Using Random-Access Memories", IEE Proceedings on Computers and Digital Techniques, vol. 2, No. 1, Feb. 1979, pp. 29-40.

Austin, J., "Associative Memories and the Application of Neural Networks to Vision", In R. Bealse (Ed.), Handbook of Neural Computation, Oxford: Oxford University Press, 1995, 17 pages.

Austin, J. et al., "Distributed Associative Memory for Use in Scene Analysis", Image and Vision Computing, vol. 5, No. 4, Nov. 1987, pp. 251-260.

Casasent, D. et al., "High Capacity Pattern Recognition Associative Processors", Neural Networks, vol. 5, 1992, pp. 687-698.

Flynn, M.J. et al., "Sparse Distributed Memory Prototype: Principles of Operation" Technical Report CSL-TR-87-338, Computer Systems Laboratory, Stanford University, Feb. 1988, pp. 1-85, 87.

Jaeckel, Louis A., "A Class of Designs for a Sparse Distributed Memory", RIACS Technical Report 89.30 NASA Ames Research Centre, Jul. 1989, pp. 1-40.

Kohonen, Teuvo, "Correlation Matrix Memories", IEE Transactions on Computers, vol. C-21, No. 4, Apr. 1972, pp. 353-359.

Kristoferson, Jan, "Some Results on Activation and Scaling of Sparse Distributed Memory", In Y. Uesaka, P. Kanerva, and H. Asoh (Eds), Foundations of Real-World Intelligence, Stanford: CSLI Publications, 2001, pp. 283-289.

Lomas, David, "Improving Automated Postal Address Recognition", MSc Dissertation, University of York, United Kingdom, Jun. 1996, pp. 3-116.

Maass, Wolfgang, "On the Computation Power of Winner-Take-All", Neural Computation, 12, 2000, pp. 2519-2535.

Marr, David, "A Theory of Cerebellar Cortex", Journal of Physiology, 202, 1969, pp. 437-470.

Nadal, Jean-Pierre et al., "Information Storage in Sparsely Coded Memory Nets", Network 1, 1990, pp. 61-74.

Palm, Günther et al., "Associative Data Storage and Retrieval in Neural Networks", 1996, pp. i-xli.

Schwenker, F. et al., "Iterative Retrieval of Sparsely Coded Associative Memory Patterns", Neural Networks, vol. 9, No. 3, 1996, pp. 445-455.

Thorpe, Simon J. et al., "Spike-Based Strategies for Rapid Processing", Neural Networks, 14, 2001, pp. 715-725 (attached reprint pp. 1-28).

Turner, M. et al., "Matching Performance of Binary Correlation Matrix Memories", Neural Networks, 10, 1997, pp. 1637-1648 (attached reprint pp. 2-47).

Verhoeff, Tom, "Delay-Insensitive Codes—An Overview", Distributed Computing, 3, 1988, pp. 1-8.

Willshaw, D.J. et al., "Non-Holographic Associative Memory", Nature, vol. 222, Jun. 7, 1969, pp. 960-962.

Furber et al., Neural Networks 17 (2004), p. 1451.

Jaecket, "A Class of Designs for A Sparse Distributed Memory", Research Institute for Advanced Science, Nasa Ames Research Center, Jul. 1989, pp. 1-40.

* cited by examiner

DIGITAL MEMORY

RELATED APPLICATION

This application is a U.S. national phase of international application PCT/GB02/04650 filed 14 Oct. 2002 which designated the U.S. and claims benefit of GB 0207372.4, dated 28 Mar. 2002, the entire content of which is hereby incorporated by reference.

BACKGROUND

1. Technical Field

The present invention relates to a digital memory.

2. Related Art

The increased use of computer systems and digital electronic devices has resulted in a number of different memory structures being proposed. The wide range of applications requiring a digital memory means that memories having different properties are required.

For example, memories for use in a conventional stored program computer require high levels of data integrity, as a single incorrect bit will cause the computer to malfunction. A conventional computer memory requires that a read address is known exactly for retrieval of information stored at a particular address. This is because a conventional memory stores a string of N binary digits (hereinafter a word) at a specific location within the memory. Only one word is stored at a particular location at a particular time.

In some applications involving the storage of large quantities of data some degree of error in data retrieved from the memory is acceptable, and can be overlooked by the system. Furthermore, in some cases it may be necessary to allow retrieval of data using an inexact read address. The present invention is concerned with a memory suitable for such applications.

One known memory structure has been developed by Kanerva and is described in Kanerva P., "Sparse Distributed Memory". MIT Press; 1988 and also in Kanera P., "Self-propagating search: A Unified Theory of Memory", Report No. CSLI-84-7, Stanford University 1984. Here a large number of address decoders are connected to a data memory comprising a number of word lines. Each address decoder is connected to a different word line within the data memory. Each decoder is identified by an address in the form of a large binary number.

When writing data to the memory, an input address is presented to the set of decoders, and the decoders having an identifier within a predetermined Hamming distance of the input address are activated. The word lines connected to the activated decoders are then selected to receive write data. When data is to be recovered from the memory, an address is presented to the decoders, and a number of word lines are again activated. Summing each bit of each activated word line, and applying an appropriate threshold allows data written to the memory to be recovered. Writing and retrieving data in this way allows the effects of address and data errors to be minimised.

The memory structure proposed by Kanerva has a number a disadvantages. One of these disadvantages is that Hamming distance calculations require specifically designed hardware if they are to be carried out efficiently.

An alternative memory structure which seeks to overcome this disadvantage is described in WO 90/04830 (Universities Space Research Association). This system takes the basic architecture proposed by Kanerva, but determines which address decoders should be activated in response to a particular input address using a different criterion. In this system, a subset of q bits of each decoder address are assigned specific '0' and '1' values. When an input address is presented to the system, the values of the q bits of the presented address are compared with those of each address decoder. If the presented address has the same values at these q bits as a particular address decoder that decoder is activated.

BRIEF SUMMARY

It is an object of the present invention to provide an alternative memory structure to those described above.

According to a first aspect of the present invention, there is provided a memory configuration for use in a computer system, the memory comprising a plurality of address decoders each of which is allocated an identifier having a predetermined number of bits, each bit having first and second selectable states, and a data memory having a plurality of word lines of predetermined length, each of the said address decoders being activatable to select one of the plurality of word lines, and the address decoders comprising means to receive an input address having a predetermined number of bits and means to compare the identifier of an address decoder with the input address wherein the memory further comprises means to activate an address decoder if at least a predetermined minimum number of bits set to the first selectable state in the input address correspond to bits set to the first selectable state in the decoder identifier.

The benefits and advantages provided by the present invention, arise in part from the activation of address decoders on the basis of bits set to the first selectable state in an input address, while bits set to the second selectable state are ignored. In contrast, the prior art systems described above activate address decoders by comparing bits set to the first and second selectable states.

Preferably, the means to compare the identifier of an address decoder with the input address considers positional correspondence between bits set to the first selectable sate in the input address and bits set to the first selectable state in the decoder identifiers.

Each address decoder identifier may have an equal number of bits set to the first selectable state. The means to receive an input address may be configured to receive addresses containing a predetermined number of bits set to the first selectable state. Suitably, the predetermined number of bits set to the first selectable state in an input address is equal to the number of bits set to the first selectable state in each of the address decoder identifiers.

Preferably, the data memory comprises a plurality of single bit memories, such that each bit of each word line is stored in a single bit memory. The data memory may comprise a data input line containing an equal number of bits to each of the plurality of word lines. The memory configuration may further comprise data writing means to copy data from the data input line to word lines activated by the address decoders. The data input line may be configured to receive input data containing a predetermined number of bits set to the first selectable state.

The memory configuration may further comprise means to sum values stored at each bit of word lines activated by an address decoder to generate an activation level value for each bit. The memory configuration may further comprise means to generate an output word containing the predetermined number of bits set to the first selectable state. The bits set to first selectable state in the output may be a predetermined number of bits having the highest activation level.

The memory may implemented using a plurality of artificial neurons connected together to form a neural network. The plurality of address decoders may be represented by a plurality of address decoder neurons and the data memory may be represented by a plurality of data neurons.

The invention further provides a neural network memory configuration for use in a computer system, the memory comprising a plurality of address decoder neurons each of which is connected to a predetermined number of input neurons, and a data memory having a plurality of data neurons, each of the said address decoder neurons being activatable to select some of the plurality of data neurons, and the address decoder neurons comprising means to receive a signal representing a firing of an input neuron to which it is connected, wherein an address decoder neuron comprises means to activate data neurons if firing signals are received from at least a predetermined minimum number of input neurons to which the address decoder neuron is connected.

In practice, every address decoder neuron may be connected to every input neuron, with each of these connections being allocated a '1' or '0' weight. In such an implementation a '0' weight has the same effect as no connection between a particular input neuron and address decoder neuron. Thus only firing signals from input neurons connected to an address decoder neuron such that the connection has a '1' weight, will represent a connection as described in the previous paragraph.

According to a second aspect of the present invention, there is provided a method for operating a memory for use in a computer system, the memory comprising a plurality of address decoders each of which is allocated an identifier having a predetermined number of bits, each bit having first and second selectable states, and a data memory having a plurality of word lines of predetermined length, each of the said address decoders being activatable to select one of the plurality of word lines, wherein an input address having a predetermined number of bits is input to the address decoder, the identifier of an address decoder is compared with the input address and address decoders are activated if at least a predetermined minimum number of bits set to the first selectable state in the input address correspond to bits set to the first selectable state in the decoder identifier.

The input data may be presented at a data input of the data memory and the data may be written to word lines activated by the activated address decoders. The predetermined minimum number of bits is preferably set such that fewer than 100 address decoders are activated by any valid input address. The predetermined minimum number of bits is more preferably set such that less than 50 address decoders are activated by any valid input address. Most preferably, the predetermined minimum number of bits is set such that no more than 20 and no fewer than 11 address decoders are activated by any valid input address.

According to a third aspect of the present invention, there is provided a method for optimising the operation of a computer memory which comprises a plurality of address decoders each of which is allocated an identifier having a predetermined number of bits, each bit having first and second selectable states, and a data memory having a plurality of word lines of predetermined length, each of the said address decoders being activatable to select one of the plurality of word lines, the memory further comprising means to receive an input address, and means to activate one or more of the address decoders if a comparison between a decoder identifier and the input address exceeds a predetermined comparison threshold;

the method comprising determining an operationally beneficial number of address decoders to be activated in response to a valid input address, and configuring the comparison threshold such that a valid input address will activate a number of address decoders substantially equal to the operationally beneficial number of address decoders to be activated.

The comparison may compare the number of bits set to the first selectable state in the input address with the number of bits set to the first selectable state in each of the address decoder identifiers.

The operationally beneficial number may be determined so as to allow maximum error free data recovery from the data memory. This may be done using a function of the form:

$$w = f(h, P_c, D, d)$$

where:
w is the operationally beneficial number of address decoders to be activated;
h is the probability of an arbitrary bit in the data memory being set to the first selectable state;
D is the number of bits in each word line, and each word line has d bits set to the first selectable state; and
$P_c$ is the desired probability of a bit being correctly recovered from the data store;
The function may be:

$$h^{-w} \cdot w = \frac{\ln(1-h)}{\ln(P_c)} \cdot W \cdot \frac{D}{d} \cdot (D-d)$$

The operationally beneficial number of address decoders to be activated may be determined so as to allow maximum error free data recovery, while allowing some data to be recovered with errors. The operationally beneficial number may be determined using a function of the form:

$$w = f(h, D, d)$$

where:
w is the operationally beneficial number of address decoders to be activated;
h is the probability of an arbitrary bit in the data memory being set to the first selectable state;
D is the number of bits in each word line; and each word line has d bits set to the first selectable state.
The function may be:

$$\frac{(h^{-w}-1)}{w} = -(D-d) \cdot \ln h$$

Preferably, the operationally beneficial number w is set so as to have a value greater than that given by the equation:

$$\frac{(h^{-w}-1)}{w} = -(D-d) \cdot \ln h$$

and less than that given by the equation:

$$h^{-w} \cdot w = \frac{\ln(1-h)}{\ln(P_c)} \cdot W \cdot \frac{D}{d} \cdot (D-d)$$

The invention further provides a carrier medium carrying computer readable code means to cause a computer to execute procedure in accordance with the method set out above, and a computer program for carrying out the method set out above.

BRIEF DESCRIPTION OF THE DRAWINGS

An exemplary embodiment of the present invention will now be described, by way of example, with reference to the accompanying drawings, in which.

DETAILED DESCRIPTION OF EXEMPLARY EMBODIMENTS

Figure 1:
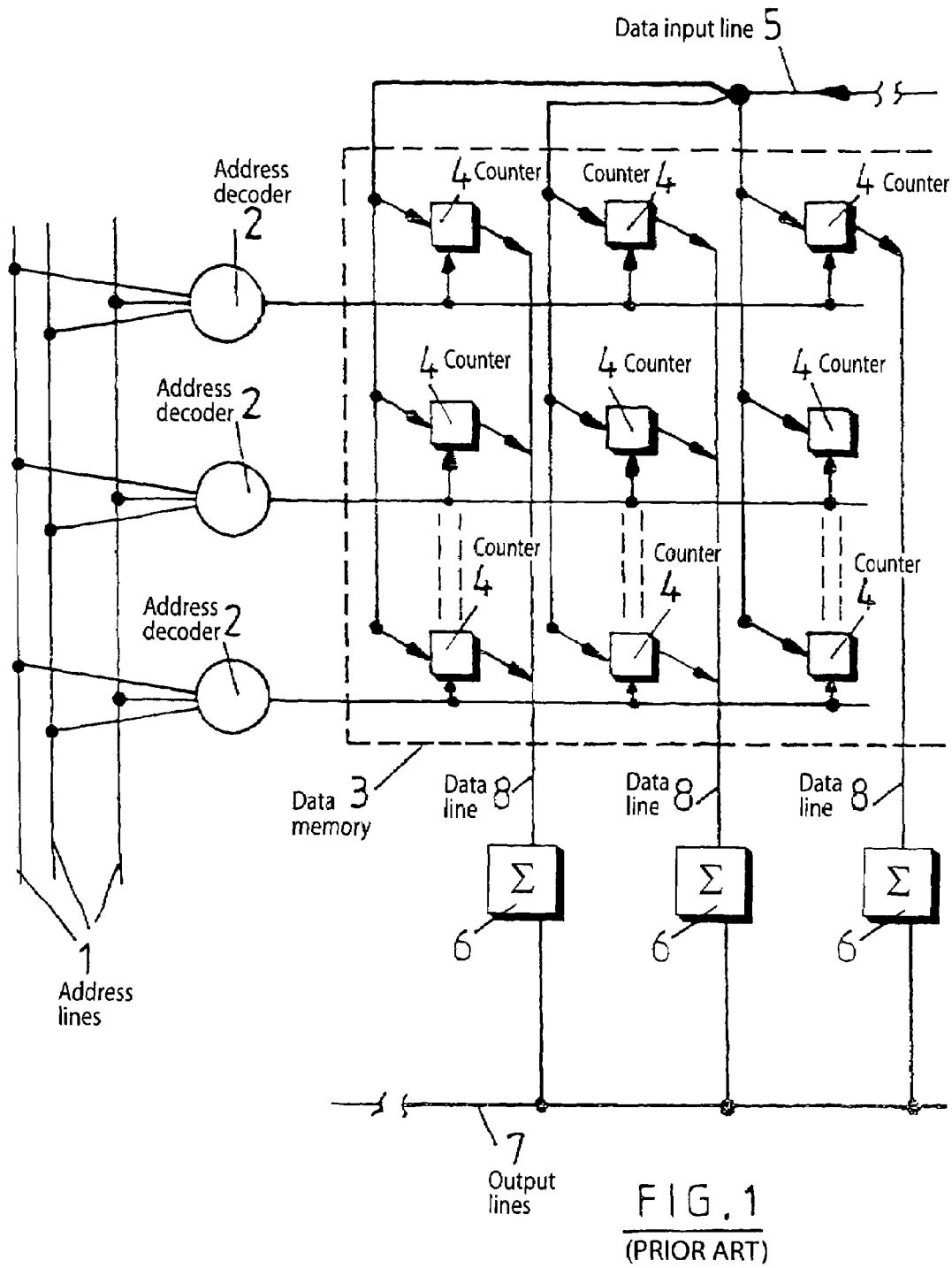
FIG. 1 is a schematic illustration of a memory configuration known from the prior art.

The address configuration described by Kanerva and outlined above is illustrated in FIG. 1. A plurality of address lines 1 are provided on which an address can be transmitted. The address is a binary number and each address line 1 transmits one bit of the address such that n lines are required to represent an n bit address. The address lines form input to an array of address decoders 2, and each address decoder 2 has an identifier in the form of an n bit binary number. The address decoders 2 are connected to a data memory 3, which comprises a number of word lines for storing data. Each word line has a storage capacity of M bits. Each bit of each word line is stored in a counter 4. Data to be written to the data memory is transmitted on a data input line 5. Data read from the memory passes along data lines 8 to adder blocks 6 and is output from the adder blocks 6 on data output lines 7.

Typically, the number of address lines 1 is of the order of one thousand, such that a one thousand bit binary number is presented to the address decoders 2. Since a very large number of addresses can be represented by a one thousand bit binary number (approximately $10^{301}$), it is not practical to have a separate word line to store data for each possible address. Accordingly, a large random sample of addresses within the possible address space are implemented. Typically one million addresses are implemented, and each of these is allocated to an address decoder 2. It is for this reason that the memory proposed by Kanerva is described as sparse, since the one million ($10^6$) decoder addresses are sparsely distributed within the available address space ($10^{301}$ addresses).

In use, an address is transmitted on the address lines 1 and is received by the address decoders 2. A comparison between the transmitted address, and the address of each address decoder is made. This comparison is performed using a Hamming distance calculation, which computes bow many bits of the transmitted address are different to the addresses associated with each address decoder 2. The Hamming distance calculation is presented in equation (1):

$$H(x, y) = \sum_{i=1}^{N} |x_i - y_i| \qquad (1)$$

where:

x is a binary vector having N elements;

y is a binary vector having N elements; and

H is the Hamming distance between x and y, being the number of bit positions at which $x_i \neq y_i$.

Decoders within a predetermined Hamming distance r of the transmitted address x are activated. This region of activation for each address may be viewed as a sphere centered at x and having a radius r. For example, Kanerva has shown that if each address has 1000 bits, and the predetermined Hamming distance r is 451 then the spherical region of activation contains about 1/1000 of the addresses associated with address decoders. In use, a processor computes a Hamming distance between each decoder address and a presented input address. If this distance is less than r for a particular address decoder, then that the decoder is activated.

Details of a process for writing data to memory, in the system proposed by Kanerva will now be described. When a given address decoder 2 is activated, data presented at the data input 5 of the memory is written to the word line which is connected to the activated address decoder. Since activation of an address decoder is initiated whenever an address occurs which is within the predetermined Hamming distance of that address decoder, the data will be written to a number of different word lines. Similarly, there are a number of different addresses which will which activate the same address decoder. This means that data will be written to a particular word line for a number of different input write addresses.

Each word line comprises M counters, each of which stores a single bit of data. The counters at a given word line allow linear accumulation of a number of M-bit words stored at that word line. If a '1' is presented at a particular bit of a word line, the corresponding counter 4 is incremented. If a '0' is presented at a particular bit, the counter 4 associated with that bit is decremented.

It should be noted that the counters will have a finite capacity, and once this capacity has been reached through successive data writes, further writing of data will have no effect. For example, if the counter has reached its maximum value through successive writing of '1's, writing another '1' to that counter can have no effect. Similarly, if the counter has reached its minimum value through successive writing of '0's, writing another '0' to that counter can have no effect. It is usually sufficient that 8 bit counters are used, each having a range of ±127. In practice, it may be sufficient to implement 2 bit or 4. bit counters. It should be noted however that up-down counters of any bit length are a considerable overhead in the memory proposed by Kanerva.

The address decoders 2 are configured such that for one million address decoders 2, a random address is within the predetermined Hamming distance of about 1000 of the decoders. Thus, for a random input address, input data will be written to 1000 word lines within the data memory 3, the appropriate counters 4 of each word line being incremented or decremented as described above.

Details of a process for retrieving data from memory, in the system proposed by Kanerva will now be described.

Data is retrieved from the memory by providing an input address on the address lines 1. If this input address is identical to that used for writing the data that is to be retrieved, the same address decoders will be activated, and data from the correct word lines will be retrieved.

If an address close to the address used for writing is presented, many of the address decoders 2 activated to write the data will be activated to read the data. However, it should be noted that some decoders activated for writing will not be activated, and others which were not previously activated will now be activated. This results in noise being present in the retrieved data. Assuming that there are a sufficient number of decoders in common between the read and write procedures, the correct data is still output from the adders 6, and the effects of noise are mitigated. This in an advantageous feature of the memory described by Kanerva.

The values held in the counters 4 of each word line connected to an activated address decoder are output onto data lines 8 during a read cycle. The values output on each data line 8 are added by an adder 6. The adders whose output exceeds a predetermined threshold generate an output '1' on the output data lines 7 and those which do not exceed the threshold generate an output '0'.

Kanerva has determined that the structure and function of the memory means that of the one thousand bits in an input address, only six hundred bits need be correct in a read address to allow successful retrieval from that same input address. For example, if a bit is set to '1' in one thousand of the word lines during the writing of data, it would be expected that the adder 6 connected to the counters holding values for that bit would output 1000. However, if only a majority of the one thousand word lines to which data was written are retrieved by a retrieval address, the adder will in general output a value which will be interpreted correctly. Thus, the memory proposed by Kanerva has useful error correction properties and allows the effects of noise described above to be mitigated.

An N-of-M code is a code in which N bits of an M bit binary number are set to '1'. Any N-of-M code therefore comprises N bits set to '1', and M-N bits set to '0'. Each value represented by the code differs in the order in which the '1's and '0's appear. N-of-M codes are self timing in that when N '1's have been received it is known that the code is compete (i.e. a value has been received), but if less than N '1's have been received it is known that the code is incomplete.

Figure 2:
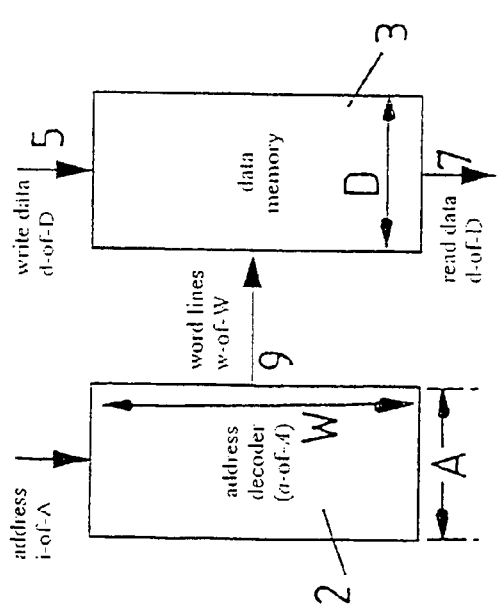
FIG. 2 is a schematic illustration of a memory configuration in accordance with the present invention.

The memory configuration of the present invention takes the sparse distributed properties of the prior art memory of FIG. 1 and introduces several applications of N-of-M coding so as to provide the memory with a number of enhancements which are set out in further detail below. A memory configuration which embodies the present invention is illustrated at a high level in FIG. 2. It can be seen that the general configuration is similar to that of FIG. 1, and like reference numerals are used where appropriate. Only differences between the memory of FIG. 1 and that provided by the invention will be discussed in further detail here.

In general, the memory comprises W address decoders 2, w of which are activated for a particular read or write. Each of the W address decoders comprises an A bit address, and each of these addresses comprises a bits having a value '1'. Thus, the address of each address decoder is an a-of-A code. When an address is input to the address decoders 2, it has i bits set to a '1' value and A-i bits set to a '0' value. Thus any input address is an i-of-A code. In some implementations it is the case that all input addresses have a number of '1' bits equal to that of the addresses of the decoders (i=a). However, there is usually a marginal benefit in allowing i to be independent from a.

When an input address is received by the address decoders 2, a comparison between the a-of-A code of each decoder, and the i-of-A code of the input address is performed. Each address decoder has an associated threshold T. The threshold T determines the number of '1's which must coincide between the input address and the address of the decoder.

Simplified examples of the decoder activation procedure will now be presented. In these examples, it is assumed that there are three address decoders (A, B and C), each having a 3-of-8 code. The addresses of these decoders are as follows:

A: 01001001
B: 10001010
C: 01101000

In the description that follows, each of the addresses is indexed from left to right, starting at an index 0.

In a first scenario, the threshold for each decoder is such that at least two bits of an input address must coincide with two bits of the decoder address. Thus when presented with:

Address1: 01001000 (a 2-of-8 code)

It can be seen that decoders A and C are activated, as bits 1 and 4 of the input address are '1's and bits 1 and 4 of the addresses of decoders A and C are also '1's. Thus the threshold of two coincident bits is achieved. Decoder B is not activated, as only one of '1's is coincident (bit 4) between Address 1 and decoder B.

Similarly, when presented with an address:

Address2: 01000011 (a 3-of-8 code)

and assuming that the threshold T remains unchanged, it can be seen that Address2 has '1's in bits 1 and 7 and decoder A has '1's in the same positions, meaning that decoder A will be activated. Decoders B and C are not activated, as only one '1' bit of each decoder address is coincident with a '1' in Address2.

The activation procedure described above activates w decoders from a total of W. Thus, the activation pattern is a w-of-W code. This is similar to the process described above with reference to FIG. 1, although it is important to note that the threshold T is preferably set so as to ensure that an optimum or near optimum of number of address decoders fire during a given read or write cycle. This optimum number has typically been found to be far less than the number activated in the memory proposed by Kanerva. The inventor has realised that data can be read from or written to the memory with sufficient accuracy using lesser number of decoder activations, and that activating one thousand decoders, as in Kanerva's system, is unnecessary. A more detailed analysis of this characteristic of the memory system is presented below.

The w activated decoders in turn select w word lines to which data is to be read from or written to. Thus, the communication between the address decoders 2 and the word lines of the data memory 3 is a w-of-W code (i.e. w) activated decoders of W decoders in all). It should be appreciated that it is not usually practical to ensure that w is constant, given the activation procedure involving independently activated address decoders, as described above. The communication of this w of W code from the address decoders 2 to the data memory 3 is denoted by an arrow 9 in FIG. 2.

The w activated decoders select w word lines. Write data is presented to write data to the data memory 3, and read data is read from the data memory 3. The reading or writing is effected at each of the w activated word lines. The input data 5 is considered to represent a d-of-D code, where each word line comprises D bits, d of which are set to '1's. Given that each input is a d-of-D code, each write data operation will be writhing data containing d '1's.

Each bit of each word line is stored in a conventional binary single bit memory. All bits of all word lines are initially set to '0'. When a '1' is to be written to a bit, the '0' value is replaced by a '1'. Once a bit is set to '1' it is never reset to '0', even if a subsequent write cycle attempts to write '0' to that bit. That is once a data write operation has set a value, any further increase in this value is simply noise, and can therefore be discarded. This storage procedure is based on the unipolar nature of N-of-M codes, and the reasons for its reliability are given below.

When data is to be read from the data memory 3, an address is presented to the address decoders 2 which results in w address decoders being activated. These w address decoders in turn activate w word lines in the data memory 3. Each word contains D bits, and the contents of each bit of each activated word line are summed, to yield D outputs. These sums are hereinafter referred to as activation levels. It is known that all write data is a d-of-D code, it should therefore be the case that the data read from the memory is also a d-of-D code.

If a single write cycle writes a value to a particular address, and this same address is presented for a read data operation (without an intervening further write cycle) it can be expected that the activation level of each bit set to '1' in the write data will be w, while the activation level of each bit set to '0' in the write data will be zero. Thus, it can be easily seen which bits should be set to '1' in the output data.

However, if two write cycles write data to different input write addresses, it may be that some of the address decoders activated during the first write cycle are also activated during the second write cycle. That is, some word lines within the data memory 3 will contain some bits set to '1' as a result of the first write cycle and some bits set to '1' as a result of the second write cycle.

When an address equal to the first write address is presented to the address decoders 2, the read data procedure activates w word lines, and calculates activation levels as described above. Given he action of the intervening write cycle, these activation levels will contain some values derived from the second write, that is some bits which were set to '0' in the first write cycle will now have a non-zero activation level, although these activation levels should be less than that of the bits set to '1' during the first write cycle. That is, more than d bits will have non-zero activation levels.

As it is known that the output data should be a d-of-D code, a modified winner takes all (WTA) algorithm is applied to determine the d bits having the highest activation level. These d bits are those which were most likely set to '1' during the writing of data to that address, and are accordingly set to '1' in the output data.

A WTA algorithm normally determines a single winner from a collection of data. In this case, the modified algorithm, (hereinafter referred to as a k-WTA algorithm) determines d values which have the highest activation level, and the bits having these values are set to '1' in the output. That is, these d bits are the "winners." in the algorithm. A k-WTA algorithm can be implemented by sorting the D values using any suitable sorting algorithm, and selecting the d highest values from these sorted values.

It is important to note that the application of N-of-M coding to the data memory allows this form of read process to be employed, as it is known how many '1's should appear in the output data. In the system proposed by Kanerva, where data written to the memory is binary, there is no way of knowing how many '1's should appear in the output data, and accordingly Kanerva uses counters as storage elements to accumulate data written to each bit, the contents of the counters being summed, and a threshold being applied to generate an output.

It was noted above, that a single bit memory is never incremented past '1'. This is, because the value at a particular bit can only ever be '1' or '0'. Therefore, incrementing past '1' must mean that some noise is stored at that bit which is undesirable. This noise is generated by two write addresses activating a common word line. In the present case, the d-WTA algorithm can correctly identify which bits should be set to '1', without the need for counters which can be incremented past '1'. Kanerva's implementation of up-down counters, and a zero threshold is no longer necessary to determine whether a particular output bit should be set to '0' or '1'. Thus the present invention provides a memory in which data is stored in conventional single bit memories and not in counters. This results in a great saving in implementation cost. Furthermore, recent developments have resulted in large quantities of suitable memory (RAM) being available cheaply and efficiently.

A common measure of the effectiveness of a memory is its storage capacity, in terms of the number of bits of information that may be usefully stored for each bit of the memory. Using this measure, a system embodying the present invention yields considerable benefits over that proposed by Kanerva. The main reason for this greater storage capacity arises from the writing of data to a smaller number of word lines. Typically, the inventor has discovered that while Kanerva wrote data to some 1000 word lines, data can be written to a far smaller number of word lines while retaining the benefits of Kanerva's memory, and obtaining greater storage efficiency. For example, for memory characteristics as described below, it is preferred that data is written to less than 100 word lines, more preferred that data is written to less than 50 word lines, but operationally most beneficial that data is written to between 11 and 20 word lines. An analysis of storage capacity, together with equations to determine the optimum number of word lines to which data should be written will now be presented.

The data memory 3 is a form of correlation matrix memory. Correlation matrix memories have been studied extensively in, for example, Kohonen, T. "Correlation Matrix Memories", IEEE Transactions Computers C-21(4) April 1972, pages 353-359 and Turner, M. and Austin, J. "Matching Performance of Binary Correlation Matrix Memories", Neural Networks 10(9), 1997. pages 1637-1648. An outline of this analysis is presented here as a basis for the derivation w.

It is assumed that address and data inputs are uniformly distributed over their respective spaces. The data memory 3 initially contains '0's at each bit. The measure of occupancy h is used, where h represents the probability of an arbitrary bit in the data memory being set to '1' at some point in the write process. After Z write operations the expected occupancy is given by equation (2):

$$h = 1 - \left[1 - \left(\frac{w}{W} \cdot \frac{d}{D}\right)\right]^z \quad (2)$$

The $$\left(\frac{w}{W} \cdot \frac{d}{D}\right)$$

term of equation (2) gives the probability of setting a particular bit within the data memory to '1' in a single write operation. Subtracting this term from 1, gives a value for the probability of not setting that bit to '1' in a particular operation. This subtraction is then raised to the power of Z, so as to represent the effect of Z write operations. Thus the term $$\left[1 - \left(\frac{w}{W} \cdot \frac{d}{D}\right)\right]^Z$$

provides a probability of not setting the arbitrary bit to '1' after Z write operations. Thus, in order to derive h, the probability of setting an arbitrary bit to 1 after Z operations, this term is subtracted from 1, to yield equation (2).

It can be sewn from equation (2), that h is initially 0, since Z is 0, and the right hand side of the equation simplifies to 1−1. h increases monotonically towards 1 as more data is stored in the memory Equation (2) can be rewritten using logarithms to give:

$$\ln(1-h) = Z \ln\left[1 - \left(\frac{w}{W} \cdot \frac{d}{D}\right)\right] \qquad (3)$$

The term $$\left(\frac{w}{W} \cdot \frac{d}{D}\right)$$

is small, given that d is typically much smaller than D, and w is typically much smaller than W. Therefore the natural logarithm on the right hand side of the equation can be approximated to the first term of the Taylor series. This gives an expression for the number of stored data items, as set out in equation (4).

$$Z = -\ln(1-h) \cdot \frac{W}{w} \cdot \frac{D}{d} \qquad (4)$$

The total information stored in the memory after Z write operations may be identified by considering the number of symbols that can be represented by a d-of-D code. This information content is given in equation (5).

$$I(Z) = Z \cdot \log_2[C_D^d] \text{bits} \qquad (5)$$

We can compute storage efficiency by comparing the information capacity given in equation (5) with the number of binary storage locations in the data memory to give the expression of equation 6.

$$\eta(Z) = \frac{I(Z)}{D \cdot W} = \frac{Z}{D.W} \cdot \log_2[C_D^d] \qquad (6)$$

where $\eta(Z)$ is the storage efficiency of the memory.

For a large value of D, the combinatorial term of equation (6) can be approximated by:

$$\log_2[C_D^d] = -D \cdot \left[\frac{d}{D} \cdot \log_2 \frac{d}{D} + \left(1 - \frac{d}{D}\right) \cdot \log_2\left(1 - \frac{d}{D}\right)\right] \qquad (7)$$

For a sparse memory where d is much less than D, substituting equations (7) and (4) into equation (6) yields, after simplification:

$$\eta(Z) = -\ln(1-h) \cdot \frac{1}{w} \cdot \left[\log_2 \frac{D}{d} + 1\right] \qquad (8)$$

where $\eta(Z)$ is the storage efficiency of the memory.

This shows, that the most efficient memory, for a given occupancy h, and under zero error conditions is one where data is written as a 1-of-D code (also known as a '1-hot' code), and where the smallest number of address decoders fire for a given input address. That is, d=1 and w=1. However, setting d and w in accordance with these criteria, will adversely affect the robustness of the memory under high capacity or input errors, as is described below.

In order to consider the robustness of the data memory, the retrieval of a single data word, following the writing of Z data words is considered, where the retrieval address is presented without error. The w address decoders activated by the read address will be the same w address decoders activated during the write data process. If the data written to a particular bit was a '1', then each of the w word lines should store a '1' at that bit, to give an activation level according to equation (9).

$$E(X_1) = w \qquad (b\ 9)$$

where E(X) is the activation level.

If, however, the data value written to a particular bit was a '0', the expected activation level will be:

$$E(X_0) = w \cdot h \qquad (10)$$

where h is as defined above.

Since h is less than 1, the memory can be expected to recover the written data, since the bits set to '1' will have a higher activation level than those set to '0' as can be seen from equations (9) and (10). However the activation level for a bit set to '0' is subject to statistical variation, and with some (small) probability, all the weights will have been set to '1' by other data writes. In this case, the activation level of an output that should be a '0' will be the same as that of an output which should be a '1'. This gives a possibility of a 'false 1' error condition. In the absence of write errors, it can be seen that there is no possibility of 'false 0' errors.

A 'false 1' error happens only if every bit contributing to a '0' output is incorrectly set to '1'. Thus, the probability of a '0' bit being correctly read is given by equation (11).

$$p(x_0 < w) = [1 - h^w] \quad (11)$$

That is, $h^w$ gives a value for the probability of the w bits contributing to the activation level having been incorrectly set to '1'. Thus subtracting this value from 1 gives the probability of a '0' value being correctly read, that is the probability that the w bits have not all been incorrectly set to '1'.

A data word is read correctly if each of its D−d bits set to 0 are all read correctly. The probability of correctly reading a word is given in equation (12):

$$p(\text{data word correct}) = [1 - h^w]^{D-d} \quad (12)$$

That is, the expression of equation (11) raised to the power of D−d, given that D−d bits are to be recovered in total.

If Z data words have been written to memory, the probability that every stored data word can be read correctly is given by equation (13):

$$P_c = [1 - h^w]^{Z \cdot (D-d)} \quad (13)$$

As h increases, the probability of error free recovery decreases towards zero.

Rewriting equation (13) using logarithms gives:

$$\ln(P_c) = Z \cdot (D-d) \cdot \ln(1 - h^w) \quad (14)$$

Since $h^w$ is very small where w is considerably greater than 1, the first term of the Taylor series gives a close approximation for the logarithm on the right hand side of equation (14) to yield:

$$\ln(P_c) = -Z \cdot (D-d) \cdot h^w \quad (15)$$

In order to optimally configure the data memory; it is considered that the number of address decoders W and the word length D are fixed.

It is also considered that the data coding (d-of-D) is fixed. In order to maximise the probability of correct data recovery, it can be seen from equation 13, that $h^w$, or equivalently w ln h) should be minimised. Thus, we seek a solution where:

$$\frac{d}{dw}(w \ln h) = \ln h + \frac{w}{h} \cdot \frac{dh}{dw} = 0 \quad (16)$$

Recalling equation (4):

$$Z = -\ln(1-h) \cdot \frac{W}{w} \cdot \frac{D}{d} \quad (4)$$

which can be rewritten as:

$$w \cdot \frac{Z \cdot d}{W \cdot D} = -\ln(1-h) \quad (17)$$

Differentiating equation (17) with respect to w and substituting a value of Z obtained from equation (17) gives:

$$\frac{dh}{dw} = -\frac{(1-h) \cdot \ln(1-h)}{w} \quad (18)$$

Substituting the value of $$\frac{dh}{dw}$$

from equation (18) into equation (16) gives the following formula for h:

$$\ln h + \frac{w}{h} \cdot \left( -\frac{(1-h) \cdot \ln(1-h)}{w} \right) = 0 \quad (19)$$

Simplifying to give:

$$\ln h + \frac{1}{h} \cdot (-(1-h) \cdot \ln(1-h)) = 0 \quad (20)$$

multiplying both sides of equation (20) by h:

$$h \ln h - (1-h) \cdot \ln(1-h) = 0 \quad (21)$$

Equation (21) has the solution h=0.5.

It has previously been shown that the maximum information content of a correlation matrix memory occurs when h=0.5 (See, Nadal, J-P., and Toulouse, G., "Information Storage in Sparsely Coded Memory Nets" Network 1 (1990), pages 61 to 74). The optimisation of h presented above, was concerned not with how much information the memory can hold, but how much can be recovered reliably. The maximum recoverable content therefore coincides with the maximum content.

Substituting a value of Z from equation (4) into equation (15) yields:

$$h^{-w} \cdot w = \frac{\ln(1-h)}{\ln(P_c)} \cdot W \cdot \frac{D}{d} \cdot (D-d) \quad (22)$$

Using the optimum value of h derived above, that is h=0.5, and given that W, d and D are known, and using an acceptable probability of error free recovery $P_c$ a value for w can be computed.

However, in some circumstances, totally error free recovery, (as assumed thus far) is too restrictive a requirement, given the nature of the memory. An alternative definition for information capacity of the memory is to establish the maximum number of data items that can be recovered without error, allowing that some other items may be recovered with errors.

Recalling equation (12):

$$p(\text{data word correct}) = [1 - h^w]^{D-d} \quad (12)$$

it is possible to derive an expression for the number of data items that can be recovered accurately, while others will be recovered with errors $E_c$. This expression is given in equation (23):

$$E_c = Z \cdot [1 - h^w]^{D-d} \quad (23)$$

where Z is the number of words contained in the memory.

For a given value of Z, w is varied so as to maximise $E_c$ and this maximum occurs at h=05.

If data is written to the memory until each new entry causes one or more additional readout errors, the maximum useful capacity of the memory has been reached. The point is reached when:

$$\frac{dE_c}{dZ} = 0 \quad (24)$$

Rewritting, equation (23) as:

$$\ln E_c = (D-d) \ln Z \cdot [1 - h^w] \quad (25)$$

differentiating equation (25) gives:

$$\frac{1}{E_c} \cdot \frac{dE_c}{dZ} = \frac{1}{Z} - \frac{(D-d)}{(1-h^w)} \cdot \ln h \cdot h^w \cdot \frac{dw}{dZ} = 0 \quad (26)$$

Rewriting equation (4):

$$wZ = -\ln(1-h) \cdot \frac{WD}{d} \quad (27)$$

it can be seen from equation (27), that for constant h, wZ is constant, (give, that W, D, and d) are fixed. Thus:

$$\frac{dw}{dZ} = -\frac{w}{Z} \quad (28)$$

Substituting equation (28) into equation (26) gives:

$$\frac{(h^{-w} - 1)}{w} = -(D-d) \cdot \ln h \quad (29)$$

Equation (29) gives an alternative value for optimum w, when the object is to retrieve as many words as possible correctly, while retrieving some words with errors. The value of w which can be obtained from equation (29) is smaller than that obtained from equation (22). This reflects the fact that activating a larger number of address decoders (i.e. increasing w) results in a memory that has fewer errors but lower capacity. Conversely, a smaller value of w results in a memory producing more errors but having a larger capacity as each write data operation sets values in fewer word lines of the data memory. In both cases, the maximum extractable information occurs when h=0.5.

The inventor, having derived the expressions set out above, has determined that a memory embodying the present invention can be much improved if w is set so as to lie between the values determined by equations (22) and (29).

Figure 4:
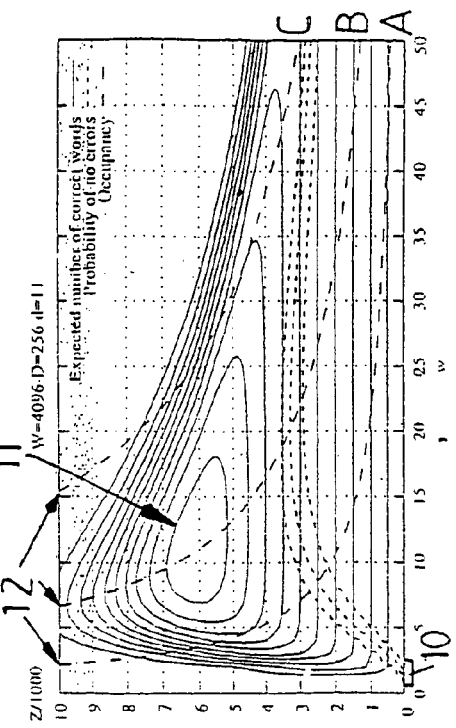
FIG. 4 is a contour plot of the three-dimensional plot of FIG. 3.
Figure 3:
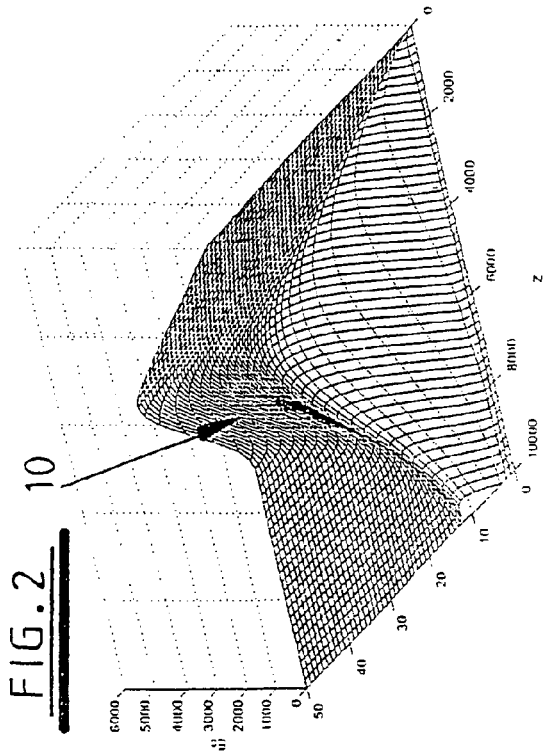
FIG. 3 is a three-dimensional plot showing storage capacity for a particular configuration of the memory illustrated in FIG. 2.

The analysis described above will now be described with reference to FIGS. 3 and 4. FIG. 3, shows a three-dimensional plot of equation (23). An axis labelled Z represents the number items written to memory, an axis labelled w axis represents the number of address decoders activated by a read or write operation, and an axis labelled $E_c$ represents the quantity given by equation (23). FIG. 4 is a contour plot of the plot of FIG. 3 where the w and Z axes represent the same quantities as the respective axes in FIG. 3. The example system illustrated in the graphs is one in which there are 4096 address decoders (i.e. W=4096), and data is stored using an 11-of-256 code (i.e. d=11 and D=256). Other configurations show similar results.

Referring first to FIG. 3, it can be seen that the number of words which can be correctly retrieved $E_c$ increases as more data is written to memory, (i.e. as Z increases), but falls off sharply as Z becomes too large (a cliff like formation 10).

That is, after a number of data writes, the memory becomes saturated, and the number of words that can be correctly recovered falls off sharply.

Further analysis will now be presented with reference to FIG. 4. The continuous contour lines show the expected number of correct words ($E_c$) varies with the number of stored entries (Z) and the number of activated address decoders (w). The peak value of $E_c$ is 5332, with an error rate of approximately 11%. This peak capacity is greater than the number of word lines (W=4096). The central contour line 11 is drawn at $E_c$=5000, and subsequent contours are drawn in steps of 500. The south face of the plot is very nearly planar and $E_c$ is very close to Z except at the west side of the plot where w is small. Performance falls off rapidly if either w is to small or Z is to large, as shown by the steep slopes at the west and north sides of the plot respectively.

Superimposed on the continuous contours described above, are two other sets of data. A first data set contains three hyperbolae 12 drawn in long-dashed lines. Each hyperbola represents the values of w and Z which generate a given value for h. The first of these hyperbolae. A represents points at which h=0.2, a second hyperbola B represents h=0.5 and a third hyperbola C represents h=0.8. It can be seen that the line denoting optimal occupancy (h=0.5) passes through the peak of the plot.

Three further curves 13 show how values of w and Z affect the value of $P_c$. The three curves, reading from left to right represent $P_c$ values of 0.1, 0.5 and 0.9 respectively. It can be seen from FIG. 4 that the peak of each of the curves 13 lies on the line h=0.5. It should be noted that the three curves 13 are close together indicating that capacity is relatively insensitive to the probability $P_c$.

Given the preceding discussion, it can be seen that the optimum value for w for maximum correct data recovery, with other data being recovered with errors occurs is at the peak of the plot. That is w=11. The optimum value for error free recovery is read from the point at which the central hyperbola B crosses the central curve of the curves 13. (that is the point at which the h=0.5 line crosses the $P_c$=0.5 line). In this case w=20, which is above twice the value for recovery with errors. In order to determine the value of w for error free recovery, it is necessary to locate the maximum of the $P_c$ curve. However, as this curve is very flat, detecting the maximum is very difficult. As it is known that this maximum occurs at a point where h=0.5, it is possible to take the point of intersection of the line $P_c$=0.5 and h=0.5 to determine the value of w for maximum error free data recovery. Therefore, according to the developments made by the invention, any memory having the parameters set out above is optimally operated with a value of w between 11 and 20.

The preceding discussion has proposed a novel way to determine an optimal value for w and benefits of such a determination have been presented. However, it should be noted that as each address decoder fires independently, it is difficult to ensure that exactly w address are activated by each input address, that is there will be some variation in w. The analysis presented above is now modified in the light of this observation.

It has been explained that a threshold T is applied to an address decoder to determine the number of bits that need correspond between an input address and a decoder identifier if a decoder is to be activated. The activated address decoders are those which have at least T bits of their input corresponding with the input address.

The probability that a first $N_1$-of-M code has T '1's in common with a second $N_2$-of-M code is given by equation (30):

$$p(T) = \frac{C_{N_1}^T \cdot C_{M-N_1}^{N_2-T}}{C_M^{N_2}} \quad (30)$$

Since the address decoders having T bits in common with the input address are activated, the mean value of w, denoted ŵ can be derived using equation (31):

$$\hat{w} = \frac{W}{C_A^a} \cdot \sum_{k=T}^{a} C_i^k \cdot C_{A-i}^{a-k} \quad (31)$$

If the memory is operating with error free input the same address decoders will always be activated by a given input address. However, there will be some statistical variation in the number of decoders that are activated by different input addresses. For a given input address, the probability of any one address decoder being activated in given by:

$$pa = \frac{\hat{w}}{W} \quad (32)$$

The W address decoders give a binomial distribution for w, with a mean in accordance with equation (31), and a variance in accordance with equation (33):

$$\sigma_a^2 = W \cdot pa \cdot (1-pa) \quad (33)$$

The probability of w taking a particular value w' is:

$$P_{w'} = (1-pa)^{W-w'} \cdot pa^{w'} \cdot C_W^{w'} \quad (34)$$

Equation (13) above gives an expression for the probability that all of the stored data values can be recovered without error. Given equation (34), equation (13) can be modified to give:

$$P_c = \prod_{w'} [1 - h^{w'}]^{Z \cdot P_{w'} \cdot (D-d)} \quad (35)$$

That is, equation (13) is modified to take into account variance in the value of w.

Similarly equation (23), which gives a value for the expected number of correctly recoverable data items (ignoring those recovered with errors) becomes:

$$E_c = \sum_{w'} P_{w'} \cdot Z \cdot [1 - h^{w'}]^{(D-d)} \quad (36)$$

Figure 5:
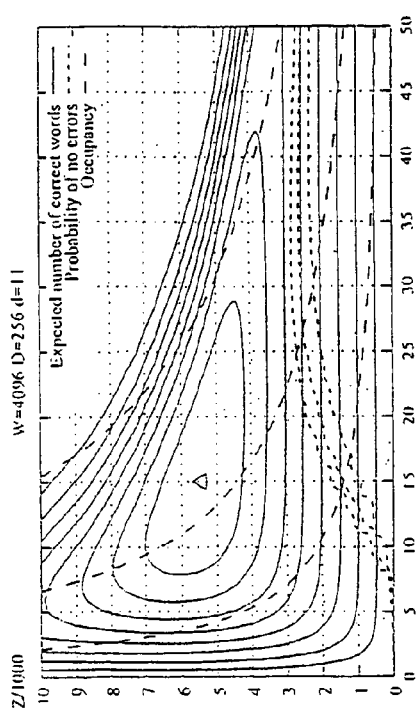
FIG. 5 is the contour plot of FIG. 4 amended to take into account independently activated address decoders.

Given these amendments to the values of $E_c$ and $P_c$ to take into account the binomial distribution of w, the contour plot of FIG. 4 is modified to that shown in FIG. 5. The contour lines, hyperbolae and curves denote the same information as those of FIG. 4. The vertical (Z) axis of FIG. 5 represents the same quantity as the respective axis of FIG. 4. The w horizontal is adjusted so as to reflect the mean value of w).

In this case, the peak value of $E_c$ is lower at $E_c$=4445, where Z=5440 and w=15. This peak value no longer occurs at h=0.5, but now occurs at h=0.575. The error free performance is considerably worse at lower values of w, but the general shape of the plot is unaffected. However, it can be seen that given the binomial distribution of w, the value of T must be set so as to give w a higher mean value than those proposed above. The value of T required can be determined by rearranging equation (31), and using suitable values for a, A, i., and w to determine T.

Figure 6:
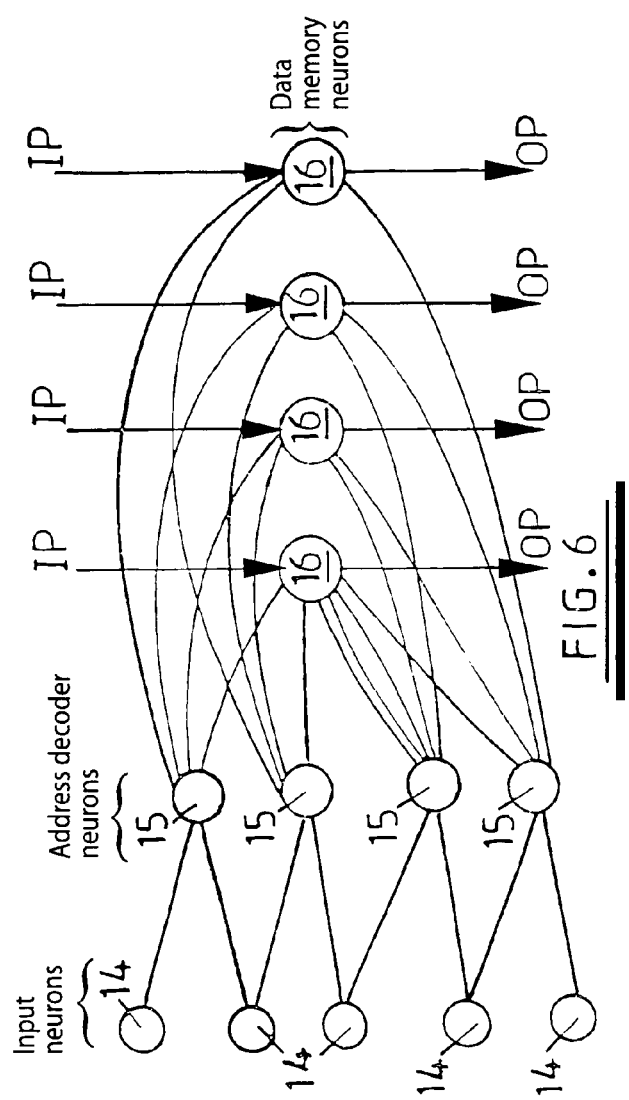
FIG. 6 is a schematic illustration of an artificial neural network which may be used to implement a memory in accordance with the present invention.

The system of the present invention can be implemented using artificial neural network technology, and such an implementation is now described. The basic structure of a suitable artificial neural network is shown in FIG. 6. The neural network comprises a layer of input neurons 14 connected to a layer of address decoder neurons 15. The data memory comprises D neurons 16. Each data neuron 16 is connected to each address decoder neuron 15. Each data neuron 16 has a write data input IP and a read data output OP.

The system is particularly suited to an implementation based upon leaky integrate-and-fire spiking neurons, through other neuronal models are also applicable. An integrate and fire neuron has n inputs, and takes a weighted sum of these inputs. This sum is known as the activation level of the neuron. A neuron fires only if the activation level exceeds a predetermined threshold. The implementation described below is based upon spiking neurons, which output a single pulse—that is a neuron either fires and generates a pulse or it does not fire and does not generate a pulse. Thus the output of a neuron can be considered to be a digital 0/1 output. The leaky property of the neurons means that an input is maintained by a neuron for a predetermined period of time. After this time, the activation level falls back towards zero. Thus, if the inputs fire in waves, only inputs from one given wave will be taken into account in any activation level calculation, as other inputs will have "leaked" back to zero. This 'leaky' property is important, as it ensures that a neuron does not fire incorrectly, due to the effects of previous inputs. The 'leaky' property ensures that the neurons within the system settle down into inactive states between 'waves' of activity.

An address in the form of an i-of-A code is input to the address decoder neurons 15 from the input neurons 14. This input is a series of i spikes on i of the A input neurons to the system, arriving at approximately the same time. These spiking neurons contribute to the activation level of some of the address decoder neurons, as is described below.

The address decoder comprises W address decoder neurons 15. Connections between the input neurons 14 and the neurons associated with the address decoders are fixed. Similarly, the threshold at which the address decoders neurons fire is also fixed. For example, in the simplified illustration of FIG. 6, it may be that at least one of the two input neurons 14 connected to a particular address decoder neuron 15 must fire, if that address decoder neuron is to fire. That is, each address decoder neuron has a threshold of 1.

Figure 7:
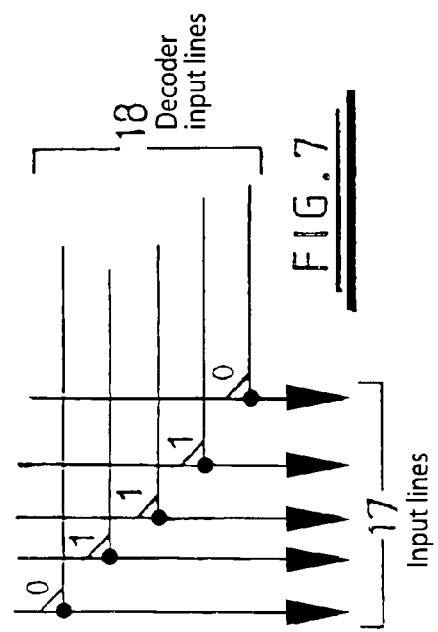
FIG. 7 is a schematic illustration of a first configuration for connections between input neurons and address decoder neurons in an artificial neural network having a general form similar to that of FIG. 6.

A matrix can be formed representing the connections between the input neurons 14 and the address decoder neurons 15 and this connection matrix is complete—that is every input neuron connects to every address decoder neuron. Each address decoder neuron has A weights. a weights are set to '1' in the connection matrix and A-a weights are set to '0'. Part of a connection matrix is shown in FIG. 7. Here, connections are shown for one address decoder neuron. Five input lines 17 are each connected to a respective input line 18 of a single address decoder neuron (not shown). Each of the connections between an input line 17 and an address decoder input line 18 are allocated either a '1' weight or a '0' weight.

Reading the input lines 17 from left to right and the address decoder neuron inputs from top to bottom it can be seen that the connection between the first input line and first address decoder neuron input is allocated '0', while the connection between the second input line and the second neuron input is allocated '1'.

There are five input lines 17, and five address decoder inputs 18. Connections between three of these lines are allocated a '1' weight. Thus, each address decoder neuron is in fact allocated a 3-of-5 code as an identifier. For each of the connections having a '1' weight, an input neuron firing on the associated input line contributes to the activation level of the address decoder neuron. Conversely, for a connection having a '0' weight an input neuron firing on he associated input line does not contribute to the activation level of the address decoder neuron.

The structure shown in FIG. 7 is repeated such that each input line 17 is connected to W address decoder neuron inputs. In the view of FIG. 7 only a single address decoder neuron's inputs are shown, such that each input line 17 is connected to only to a single input 18.

Given that a '1' weight means that a firing input neuron will affect an address decoder neuron input 18 (i.e that input line represents a '1' in the identifier of the address decoder), and that a '0' is effectively a representation of no connection, (i.e. a neuon firing on this input line has no effect on the address decoder neuron) each address decoder neuron need only be connected to the i input neurons carrying '1's. This is represented in FIG. 8, where only the three input lines 17 having '1' weights are connected to inputs 18 of an address decoder neuron 15.

Figure 8:
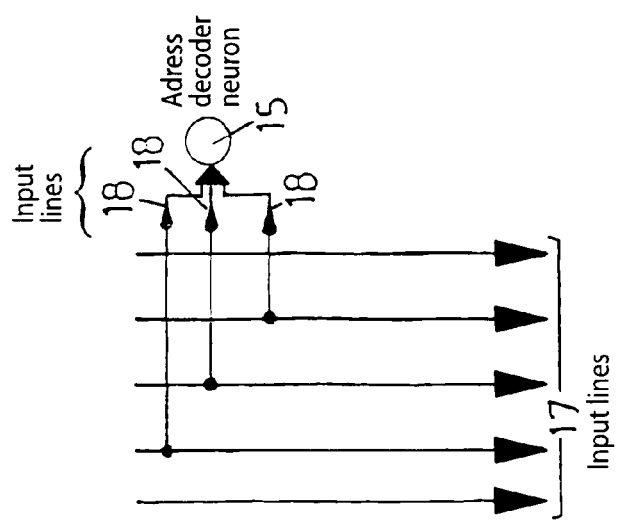
FIG. 8 is a schematic illustration of an alternative configuration for connections between input neurons and address decoder neurons to that shown in FIG. 7.

Thus, the connections between input and address decoder neurons can be viewed either as a complete connection matrix comprising '0' and '1' values (FIG. 7), or a routing table containing specific connections (FIG. 8). These two views are equivalent. It should be noted that as in the view of FIG. 7, only connections for a single address decoder neuron 15 are shown in FIG. 8, and similar connections will be required for each of the W address decoder neurons.

In general, The connections (or '1's) for each address decoder neuron are selected at random.

When spikes arrive (representing an input address) a number of address decoder neurons fire. The firing nuerons will be those which have received '1' values on a sufficient number of '1' weighted input lines, so as to raise the activation level of the address decoder neuron above the threshold T. This firing of address decoder neurons 15 is a w of W code as described above.

The data memory 3 comprises D neurons 16, each of which has the W address decoder neurons 15 as input. Each of the D data memory neurons has a unique write data input IP. The connections between the W address decoder neurons and the D data memory neurons are initially set to have zero weights. The connections from the write data inputs (not shown) have values which are initially irrelevant. However, when a write data neuron fires, it must force a respective data memory neuron into a Hebbian learning mode that persists throughout the associated incident wave of firing address decoder neurons. That is, when data is to be written, each of the data memory neurons must be activated so as to be able to store the data presented by the write data neurons.

The procedure for writing data to the data memory is now described. Firstly, d of the D write data neurons (not shown) fire, and the corresponding d data memory neurons 16 are placed in a Hebbian learning mode. The address decoder neurons 15 fire as described above, resulting in w of W code being communicated to the data memory neurons 16. The w neurons receiving spikes from the address decoder neurons, and which have been placed in Hebbian learning mode by the write data input neurons have weights set to '1'.

Once the wave of incident address decoder neuron spikes has passed, the 'leaky' property of all of the neurons causes the activation levels to return to '0'. At this point, the data memory neurons cease to be in Hebbian learning mode. After a suitable delay, the memory is in a suitable state for a further read or write cycle to be initiated. Thus it can be seen that the 'leaky' property of the neurons ensures that activation from a previous write cycle does not affect the operation of the current write cycle.

When data is to be read from the data memory, the write data neurons are inactive. A read operation is initiated by the firing of w of the W address decoder neurons as described above. The w fired address decoder neurons cause the activation levels on some data memory neurons to rise, assuming that at least some neurons have been set by a previous write cycle.

A generalised "winner takes all" (k-WTA) style of output logic selects d data memory neurons with the highest activation level and these issue spikes on their respective outputs OP to form a representation of the data output. As described above, a suitable delay is required before a further read or write cycle is initiated. A number of known methods may be used to implement the k-WTA algorithm. In one such method the output neurons fire in decreasing order of activation level, with the neuron with the highest activation level firing first. Thus, after d neurons have fired, it is known that the d neurons having the highest activation levels have contributed to the output. Further firing can then be inhibited by a counter neuron which has observed the d firing cycles and issues an inhibitory signal to prevent further firings.

The application of N-of-M coding to the address decoder logic, as described above provides a number of benefits. Particularly, as such codes are interested only in the position of '1' bits within a data value, they are particularly suited to neural network applications, where a '1' is represented by a firing neuron. In a binary system it is comparatively difficult to represent and detect a neuron not firing, making a neural implementation of a binary system difficult to realise. Thus, the application of N-of-M coding provides an effective event driven system, where events (a neuron fires) have effects and non-events (a neuron does not fire) do not have effects.

The particular selection of M and N values for an M-of-N code will, to some extent be dependent upon the application. For example, in bioinformatics applications, where DNA data is to be represented a 1-of-4 code is often chosen. This choice is made because DNA comprises a number of bases, each base being selected from a set of four possible bases, commonly referred to as G, A, T and C. Thus, each base is represented by a '1' on one of the four inputs provided by the code. That is, for example:

G=0001 A=0010
T=0100 C=1000

That is a 1-of-4 code allows four different values (a two bit binary number) to be represented. A DNA sequence is then represented as a series of 1-of-4 codes, one code for each base of the DNA sequence. Using this sequence, a four base DNA sequence will be represented by a 4-of-16 code. It should be noted that this is a restricted 4-of-16 code with a restriction such that one of the '1' bits must occur within the first four bits of the code, the second in the next four bits and so on.

A general binary code can be transformed into an N-of-M code, for example using dual-rail coding. Here, each bit of the binary code is allocated to two "rails". A pulse is transmitted on the first rail of a bit if that bit is set to '1', while a pulse is transmitted on the second rail of that bit if the bit is set to '0'. Relating this dual rail implementation to the neural network illustrated in FIG. 6, each input neuron 14 accepts input from two dual rail input neurons. That is there are ten dual rail input neurons in the system. When input is received, this will be in the form of a 5-of-10 code, with a restriction such that one '1' must occur on one of the first pair of neurons, one on the second and so. Input neurons receiving inputs from the '1' rail neurons then fire as described above.

It should be noted that the addition of dual rail technology in this way provides a system in which the dual rail inputs are operated using a restricted N-of-M code as described, while the input neurons operate in binary, with no certainty as to how many neurons will fire. This provides an effective conversion between an N-of-M system and a binary system.

It will be apparent to those skilled in the art that the memory configuration of the present invention may be implemented in terms of traditional address decoders, and word lines of data store or as a neural system as described above. It will also be apparent that the system can be implemented either by fabricating bespoke hardware components, or by configuring reconfigurable components such as Field Programmable Gate Arrays (FPGAs). Alternatively, the system may be realised by writing a suitable computer program to run on a conventional computer system. Such a system will use the hardware of the conventional computer in such a way as to simulate a memory embodying the invention. The computer program can be written in any of the large number of widely used computer programming languages, although an object oriented implementation is particularly preferred.

What is claimed is:

1. A memory configuration for use in a computer system, the memory comprising:
   a plurality of address decoders, each of which is allocated an identifier having a predetermined number of bits, each bit having first and second selectable states; and
   a data memory having a plurality of word lines of predetermined length,
   each of the said address decoders being activatable to select one of the plurality of word lines;
   the address decoders including means to receive an input address having a predetermined number of bits and means to compare the identifier of an address decoder with the input address; and
   wherein the memory further includes means to activate an address decoder if at least a predetermined minimum number of bits set to the first selectable state in the input address correspond to bits set to the first selectable state in the decoder identifier; and
   wherein each address decoder identifier has an equal number of bits set to the first selectable state and the means to receive an input address is configured to receive addresses containing a predetermined number of bits set to the first selectable state.

2. A memory configuration according to claim 1, wherein:
   the means to compare the identifier of an address decoder with the input address considers positional correspondence between bits set to the first selectable state in the input address and bits set to the first selectable state in the decoder identifiers.

3. A memory configuration according to claim 1, wherein the predetermined number of bits set to the first selectable state in an input address is equal to the number of bits set to the first selectable state in each of the address decoder identifiers.

4. A memory configuration according to claim 1, wherein the data memory comprises a plurality of single bit memories, such that each bit of each word line is stored in a single bit memory.

5. A memory configuration according to claim 1, wherein the data memory comprises a data input line containing an equal number of bits to each of the plurality of word lines.

6. A memory configuration according to claim 5, further comprising data writing means to copy data from the data input line to word lines activated by the address decoders.

7. A memory configuration according to claim 5, wherein the data input line is configured to receive input data containing a predetermined number of bits set to the first selectable state.

8. A memory configuration according to claim 1, further comprising:
   means to sum values stored at each bit of word lines activated by an address decoder to generate an activation level value for each bit.

9. A memory configuration according to claim 7, further comprising:
   means to generate an output word containing the predetermined number of bits set to the first selectable state.

10. A memory configuration according to claim 9, wherein the bits set to first selectable state in the output are the predetermined number of bits having the highest activation level.

11. A memory configuration according to claim 1, wherein the memory is implemented using a plurality of artificial neurons connected together to form a neural network.

12. A memory configuration according to claim 11, wherein the plurality of address decoders are represented by a plurality of address decoder neurons, and the data memory is represented by a plurality of data neurons.

13. A neural network memory configuration for use in a computer system, the memory comprising:
   a plurality of address decoder neurons each of which is connected to a predetermined number of input neurons;
   a data memory having a plurality data neurons, each of the said address decoder neurons being activatable to select some of the plurality of data neurons;
   the address decoder neurons including means to receive a signal representing a firing of an input neuron to which it is connected; and
   wherein an address decoder neuron comprises means to activate data neurons if firing signals are received from at least a predetermined minimum number of input neurons to which the address decoder neuron is connected.

14. A method for operating a memory for use in a computer system, the memory comprising:
   a plurality of address decoders each of which is allocated an identifier having a predetermined number of bits, each bit having first and second selectable states;
   a data memory having a plurality of word lines of predetermined length, each of the said address decoders being activatable to select one of the plurality of word lines;
   wherein an input address having a predetermined number of bits is input to the address decoder, the identifier of an address decoder is compared with the input address and address decoders are activated if at least a predetermined minimum number of bits set to the first selectable state in the input address correspond to bits set to the first selectable state in the decoder identifier;
   wherein each address decoder identifier has an equal number of bits set to the first selectable state; and
   wherein an input address has a predetermined number of bits set to the first selectable state.

15. A method according to claim 14, wherein input data is presented at a data input of the data memory and the data is written to word lines activated by the activated address decoders.

16. A method according to claim 14, wherein the predetermined minimum number of bits is set such that fewer than 100 address decoders are activated by any valid input address.

17. A method according to claim 16, wherein the predetermined minimum number of bits is set such that fewer than 50 address decoders are activated by any valid input address.

18. A method according to claim 17, wherein the predetermined minimum number of bits is set such that fewer than 20 and more than 11 address decoders are activated by any valid input address.

19. A method for optimizing the operation of a computer memory which comprises a plurality of address decoders each of which is allocated an identifier having a predetermined number of bits, each bit having first and second selectable states, a data memory having a plurality of word lines of predetermined length, each of the said address decoders being activatable to select one of the plurality of word lines, means to receive an input address, and means to activate one or more of the address decoders if a comparison between a decoder identifier and the input address exceeds a predetermined comparison threshold; said method comprising:
  determining an operationally beneficial number of address decoders to be activated in response to a valid input address, and
  configuring the comparison threshold such that a valid input address will activate a number of address decoders equal to the operationally beneficial number of address decoders to be activated.

20. A method according to claim 19, wherein the comparison compares the number of bits set to the first selectable state in the input address with the number of bits set to the first selectable state in each of the address decoder identifiers.

21. A method according to claim 19, wherein the operationally beneficial number is determined so as to allow maximum error free data recovery from the data memory.

22. A method according to, claim 21, wherein the operationally beneficial number is determined using a function of the form:

$$w = f(h, P_c, D, d)$$

where:
w is the operationally beneficial number of address decoders to be activated;
h is the probability of an arbitrary bit in the data memory being set to the first selectable state;
D is the number of bits in each word line, and each word line has d bits set to the first selectable state; and
$P_c$ is the probability of a bit being correctly recovered from the data store.

23. A method according to claim 22, wherein the function is:

$$h^{-w} \cdot w = \frac{\ln(1-h)}{\ln(P_c)} \cdot W \cdot \frac{D}{d} \cdot (D-d).$$

24. A method according to claim 19, wherein the operationally beneficial number of address decoders to be activated is determined so as to allow maximum error free data recovery, while allowing some data to be recovered with errors.

25. A method according to claim 24, wherein the operationally beneficial number is determined using a function of the form:

$$w = f(h, D, d)$$

where:
w is the operationally beneficial number of address decoders to be activated;
h is the probability of an arbitrary bit in the data memory being set to the first selectable state;
D is the number of bits in each word line, and each word line has d bits set to the first selectable state.

26. A method according to claim 25, wherein the function is:

$$\frac{(h^{-w}-1)}{w} = -(D-d) \cdot \ln h.$$

27. A method according to claim 19, wherein the operationally beneficial number w is set so as to have a value no less than that given by the equation:

$$\frac{(h^{-w}-1)}{w} = -(D-d) \cdot \ln h.$$

and no more than that given by the equation:

$$h^{-w} \cdot w = \frac{\ln(1-h)}{\ln(P_c)} \cdot W \cdot \frac{D}{d} \cdot (D-d).$$

28. A computer-readable storage medium containing a computer program which, when executed by a computer, carries out the method of claim 14.

29. A memory configuration for use in a computer system, the memory comprising:
  a plurality of address decoders each of which is allocated an identifier having a predetermined number of bits, each bit having first and second selectable states;
  a data memory having a plurality of word lines of predetermined length, each of the said address decoders being activatable to select a predetermined one of the plurality of word lines;
  the address decoders comprising means to receive an input address having a predetermined number of bits and means to compare the identifier of an address decoder with the input address, and
  wherein the memory further comprises means to activate an address decoder if at least a predetermined minimum number of bits set to the first selectable state in the input address correspond to bits set to the first selectable state in the decoder identifier.

30. A method for operating a memory for use in a computer system, the method comprising:
  allocating to each of a plurality of address decoders an identifier having a predetermined number of bits, each bit having first and second selectable states; and
  activating each of said address decoders to select a predetermined one of a plurality of word lines in a data memory having a plurality of word lines of predetermined length,
  wherein an input address having a predetermined number of bits is input to the address decoder, the identifier of an address decoder is compared with the input address and address decoders are activated if at least a predetermined minimum number of bits set to the first selectable state in the input address correspond to bits set to the first selectable state in the decoder identifier.

31. A memory configuration for use in a computer system, the memory comprising:
   a plurality of address decoders, each of which is allocated an identifier having a predetermined number of bits, each bit having first and second selectable states; and
   a data memory having a plurality of word lines of predetermined length, each of the said address decoders being activatable to select one of the plurality of word lines;
   the address decoders including means to receive an input address having a predetermined number of bits and means to compare the identifier of an address decoder with the input address;
   wherein the memory further includes means to activate an address decoder if at least a predetermined minimum number of bits set to the first selectable state in the input address correspond to bits set to the first selectable state in the decoder identifier;
   wherein the data memory comprises a plurality of single bit memories, such that each bit of each word line is stored in a single bit memory; and
   wherein the data memory comprises a data input line containing an equal number of bits to each of the plurality of word lines, the data input line being configured to receive input data containing a predetermined number of bits set to the first selectable state.

* * * * *